United States Patent [19]

Norwood et al.

[11] Patent Number: 4,969,123

[45] Date of Patent: Nov. 6, 1990

[54] DISTRIBUTED SIGNAL TRANSMISSION TO AN INTEGRATED CIRCUIT ARRAY

[75] Inventors: Roger D. Norwood, Sugarland; Jimmie D. Childers, Missouri City, both of Tex.

[73] Assignee: Texas Instruments Incorporated, Dallas, Tex.

[21] Appl. No.: 265,112

[22] Filed: Oct. 31, 1988

[51] Int. Cl.$^5$ .............................................. G11C 11/40
[52] U.S. Cl. ........................................ 365/51; 365/63; 365/189.11
[58] Field of Search .................. 365/51, 63, 205, 207, 365/189.11

[56] References Cited

U.S. PATENT DOCUMENTS 4,748,591  5/1988  Itoh et al. ............................. 365/51

Primary Examiner—Joseph A. Popek
Attorney, Agent, or Firm—Ronald O. Neerings; Thomas W. Demond; Melvin Sharp

[57] ABSTRACT

In a dynamic random access memory (10) that includes a cell array area (12) and at least one peripheral array area (14), a plurality of sense amplifier banks (20) are arranged in rows. A plurality of elongate longitudinal signal conductors (92) are formed over the cell array area (12) to intersect each of the rows. Each row has at least one transverse signal conductor (98) that is coupled to at least some of the longitudinal signal conductors (92). Inputs of the sense amplifiers (30) in the row are coupled to the transverse signal conductor (92) for receiving the global signal. A signal driver circuit (124–130) is formed in the peripheral area (14), with the longitudinal conductors (98) coupled to outputs of the signal driver circuit (124–130).

30 Claims, 6 Drawing Sheets

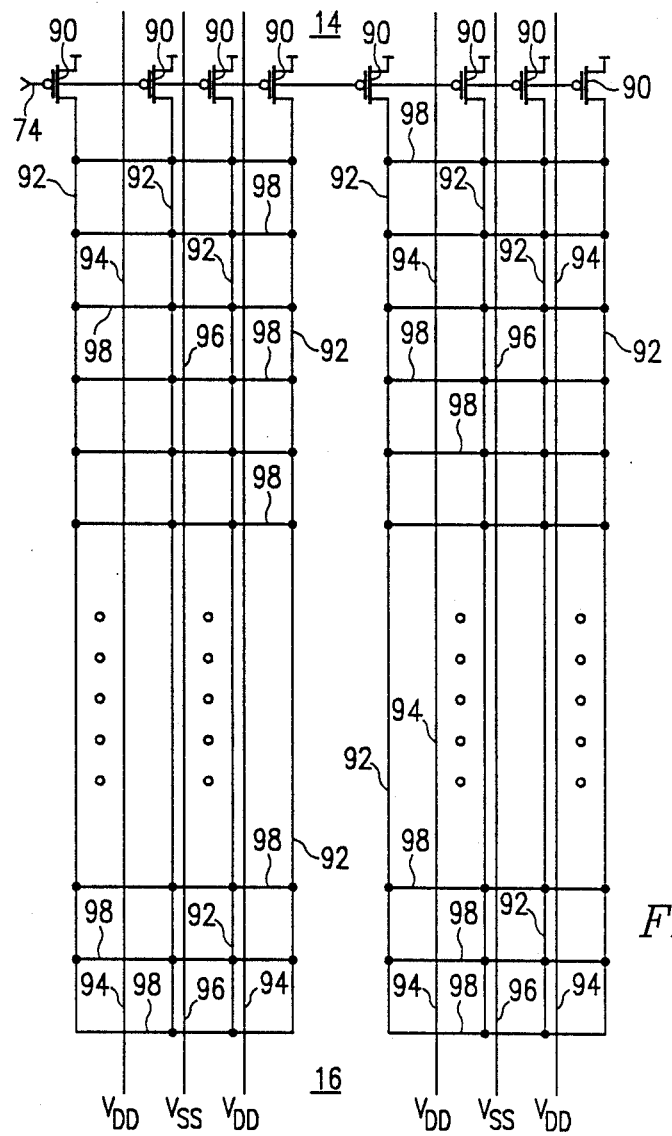
FIG. 4
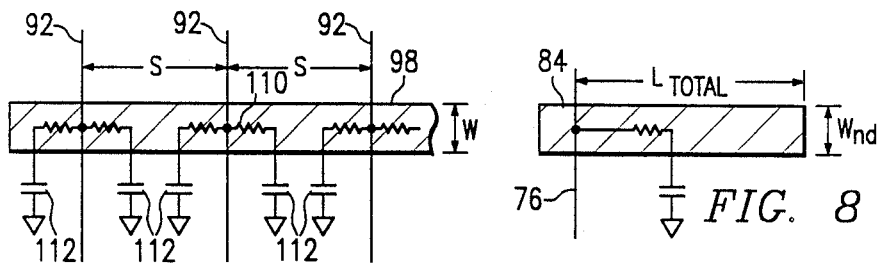
FIG. 7
FIG. 8

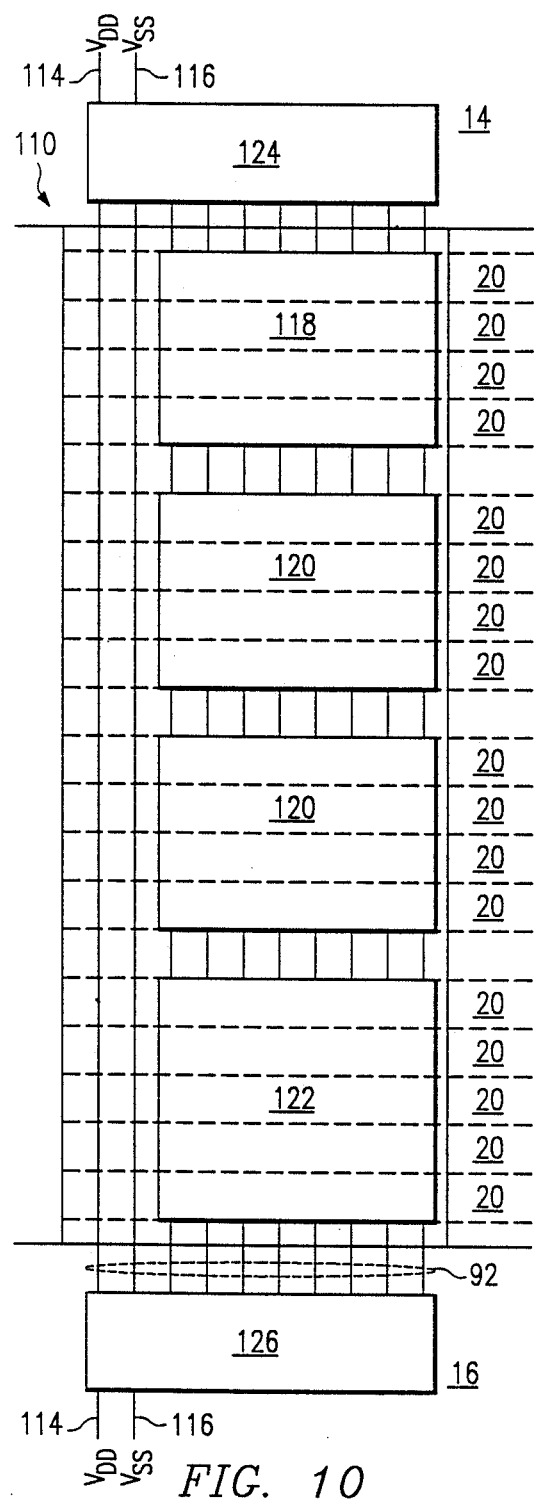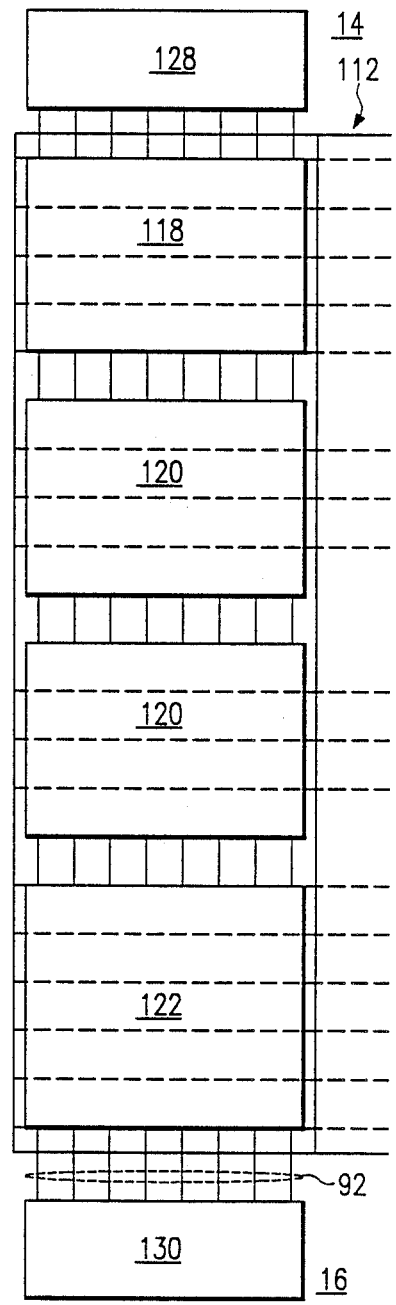
FIG. 10
FIG. 11

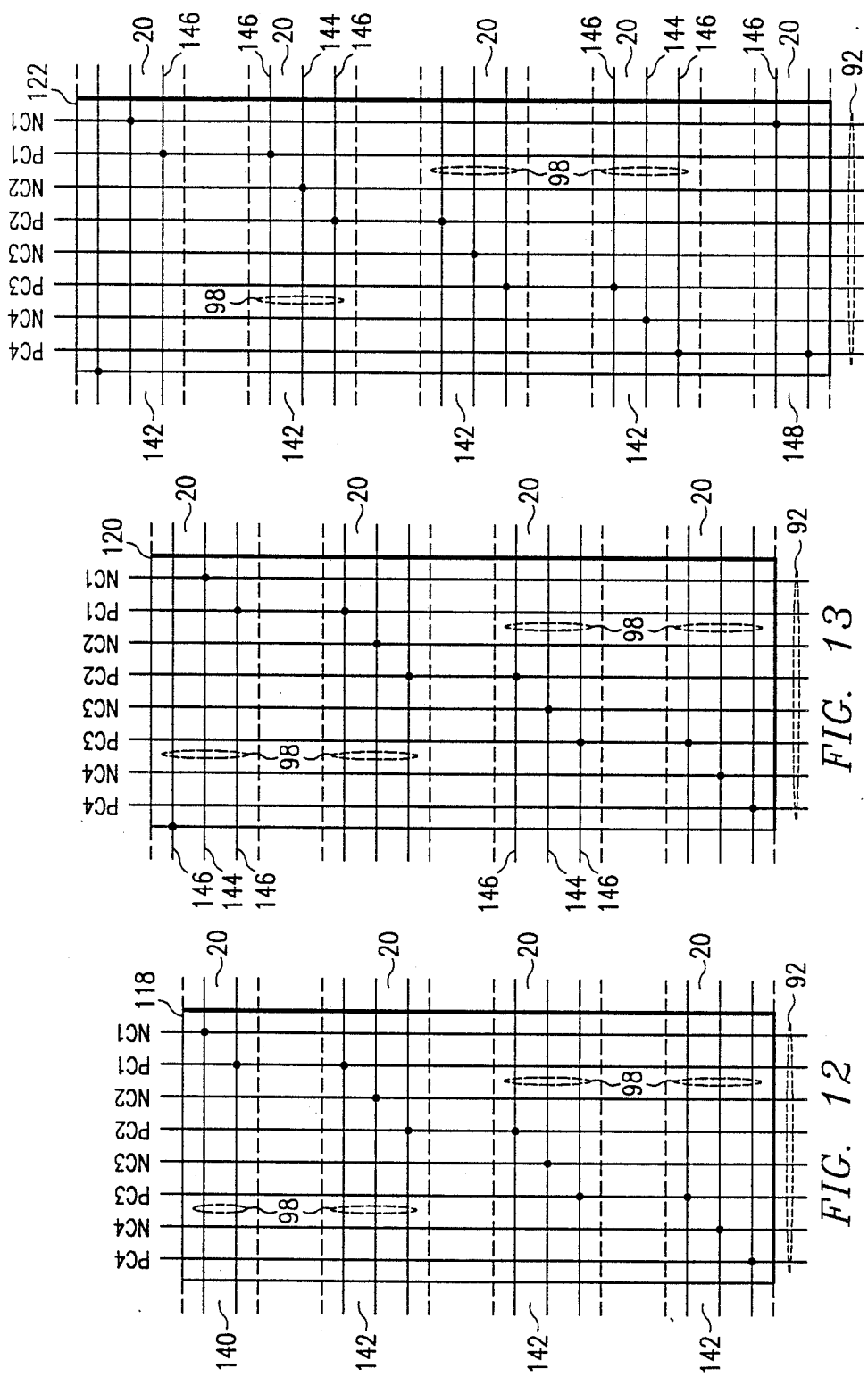

DISTRIBUTED SIGNAL TRANSMISSION TO AN INTEGRATED CIRCUIT ARRAY

TECHNICAL FIELD OF THE INVENTION

The present invention relates in general to the transmission of global signals to each of a plurality of integrated circuits formed in rows in an integrated circuit array, and more particularly relates to methods and apparatus for transmitting a global signal through a distributed network to such integrated circuits.

BACKGROUND OF THE INVENTION

In modern integrated circuit fabrication technology, units are often organized at the face of a semiconductor wafer into repeating units. It is often desirable to transmit a global signal from a peripheral portion of the integrated circuit chip to each of these integrated circuits. As the number of repeating integrated circuit units grows, the problem of routing a global signal to each of them, or to a subset of them, becomes increasingly complex.

Such a repeating circuit unit is found within a modern-day dynamic random access memory (DRAM) integrated circuit. As will be more completely described below, sense amplifiers for DRAMs are now grouped into banks that are in themselves arranged in rows and columns. Each of these banks of sense amplifiers must have routed to it a global pull-down signal, and in the case of CMOS sense amplifier designs, a global pull-up signal as well.

A conventional method of routing such pull-up and pull-down signals to each sense amplifier in the array has been to route thick conductors down the sides of the integrated circuit chip and fan out lateral or transverse signal conductors to each sense amplifier bank. As will be more completely demonstrated below, as the number of sense amplifiers grow, the required width of the signal conductors increases dramatically in order to preserve the same path of resistance. In particular, the widths of the lateral lines would have to be so wide as to add an unacceptable amount of length to each DRAM chip in the case of 4 megabit designs. A need has therefore arisen for circuits and methods for transmitting global signals to sense amplifiers in the increasingly large DRAM arrays.

SUMMARY OF THE INVENTION

One aspect of the invention comprises a distributed signal transmission circuit for an array of integrated circuits formed in rows on a chip. This circuit comprises a signal driver circuit formed in a peripheral area on the chip. A plurality of elongate longitudinal signal conductors are coupled to the driver circuit for transmitting a signal therefrom. The longitudinal conductors are formed over the array to intersect each of the rows. At least one transverse signal conductor formed in each row is coupled to at least some of the longitudinal conductors for receiving the signal therefrom. The integrated circuits formed in the row and coupled to the transverse signal conductor receive the signal. Using this distributed concept, a principal technical advantage of this distributed routing is obtained because for a given signal transmission path resistance, the width of the transverse signal conductors may be substantially decreased with respect to non-distributed signal transmission circuits.

In another aspect of the invention, several global signals are desired to be transmitted to selected ones of the rows. For example, a first signal may originate from one end of the chip, while a second signal may originate from a second end of the chip. In this instance, first and second longitudinal signal conductors are disposed in interleaved fashion over the array area located between the two ends.

In one embodiment of the invention, each longitudinal conductor is coupled to a transverse conductor in each row. But in another embodiment of the invention, each end of the integrated circuit may generate respective sets of signals that are therefore transmitted with the aid of respective interleaved sets of longitudinal conductors.

The present invention has particular application to the supply of pull-up and pull-down signals for sense amplifiers in CMOS DRAMs. In this instance, at least one pull-up signal is generated at a first end of the integrated circuit chip where a $V_{dd}$ bonding pad is placed, while a pull-down signal is originated from a second, opposed end of the array. For particularly large arrays, such as 4 megabit, a plurality of different pull-up signals and pull-down signals may be required to be generated. For each of these pull-up and pull-down signals, a separate set of longitudinal signal conductors is formed over the array area that is interleaved with the remaining sets. In a preferred embodiment, each bank of sense amplifiers within the array area is provided with at least one transverse pull-up signal conductor that is coupled to a selected one set of longitudinal pull-up conductors, and is likewise provided with at least one transverse pull-down signal conductor that is coupled with a selected one set of longitudinal pull-down conductors originating from the second end of the chip. In this manner, pull-up and pull-down signals may be delivered only to selected portions of the entire cell array area.

In addition to the principal advantage of saving a large portion of transverse signal conductor width, the present invention is also advantageous in that it results in a more even distribution of the global signal to be transmitted and further allows for a more uniform timing.

BRIEF DESCRIPTION OF THE DRAWINGS

Further aspects of the invention and their advantages will be discerned from the following detailed description taken in conjunction with the drawings in which:

FIG. 4 i a schematic electrical diagram of a distributed pull-up circuit according to the invention;

FIG. 7 is a diagram for the modelling of the resistance and capacitance of a distributed signal conductor network according to the invention;

FIG. 8 a mathematical modeling of the resistance and capacitance of a non-distributed signal conductor system according to the prior art;

FIG. 10 is a schematic diagram of a main longitudinal conductor block shown in FIG. 9;

FIG. 11 is a schematic diagram of an edge longitudinal conductor block as shown in FIG. 9;

FIGS. 12-14 are schematic wiring diagrams of certain sub-blocks shown in FIGS. 10 and 11, particularly showing the connections between the longitudinal and transverse signal conductors.

DETAILED DESCRIPTION OF THE INVENTION

Figure 1:
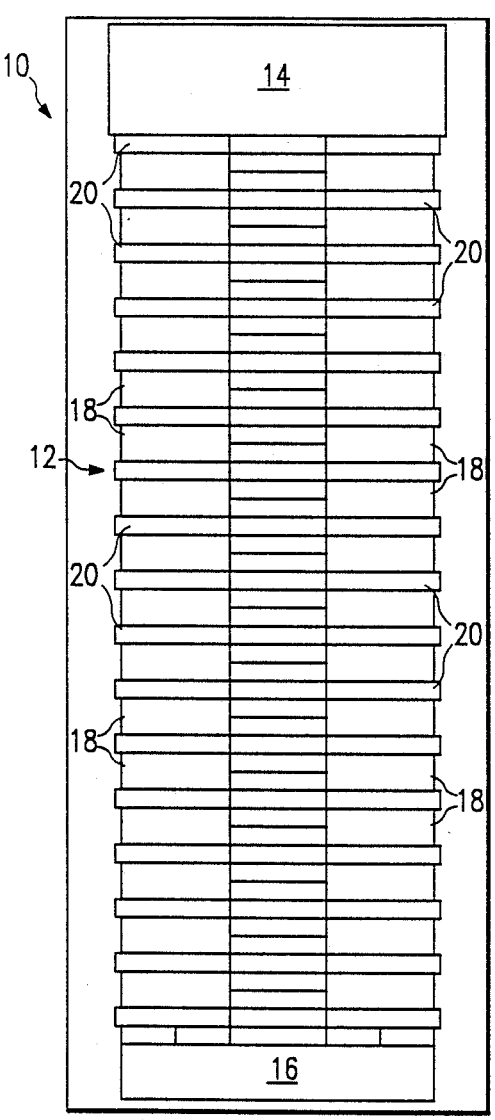
FIG. 1 is a magnified schematic plan view of a 4 megabit DRAM chip layout.

FIG. 1 is a plan view of an entire DRAM integrated circuit chip indicated generally at 10. Throughout the Figures, like numbers identify corresponding structure where possible. The illustrated DRAM chip is a 4 megabit CMOS DRAM chip. Most of the chip surface is occupied by a cell array area indicated generally at 12. A first peripheral area 14 is disposed adjacent one end of the array area 12, while a second peripheral area 16 is disposed adjacent a second, opposed end of the array area 12.

A plurality of memory cell arrays 18 as interleaved by a plurality of sense amplifier banks 20 are disposed in seventeen rows and two columns. In the illustrated embodiment, the two columns are separated by a plurality of decoders 22 and other circuitry that need not be described here.

Figure 2:
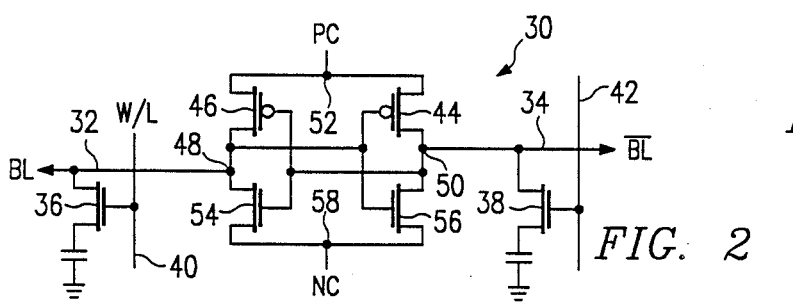
FIG. 2 is a simplified electrical circuit diagram of a single CMOS sense amplifier as used in the DRAM of FIG. 1.

A simplified electrical schematic circuit diagram is shown for a single sense amplifier in FIG. 2. The sense amplifier is indicated generally at 30. The sense amplifier 30 is, in the illustrated embodiment, one of 256 such sense amplifiers in any one bank 20. The sense amplifier 30 is disposed between a bit line (BL) 32 and its complement bit line 34 (BL). Each bit line 32 and 34 is connected to a plurality of memory cells, one of which is shown at 36. Each bit line 32 and 34 will further be coupled to a dummy cell, one of which is shown at 38. Each memory cell 36 will have a transistor gate coupled to a respective word line 40, and each dummy cell 38 will have its transistor gate coupled to a dummy cell word line 42. A pair of p-channel transistors 44 and 46 selectively couple respective bit line nodes 48 and 50 to a pull-up node 52. An opposed pair of n-channel transistors 54 and 56 couple the respective bit line nodes 48 and 50 to a pull-down node 58. Node 48 is further coupled to the gates of transistors 44 and 56, and while node 50 is cross-coupled to the gates of transistors 46 and 54.

In the CMOS mode of operation, the bit lines 32 and 34 are precharged to $V_{dd}/2$ and a particular cell 36 is selected by a high state on a word line 40. An opposed dummy cell 38 is also actuated by a dummy line 42. Depending on whether a logic one or a logic zero is stored within the cell 36, one bit line will be at a voltage slightly higher than the other bit line. This slight difference in the bit line voltages is accentuated by the application of a pull-up signal PC on node 52 and a pull-down signal NC on node 58. This will cause one of the bit lines to rise to $V_{dd}$ while the other of the bit lines falls to zero.

Figure 3:
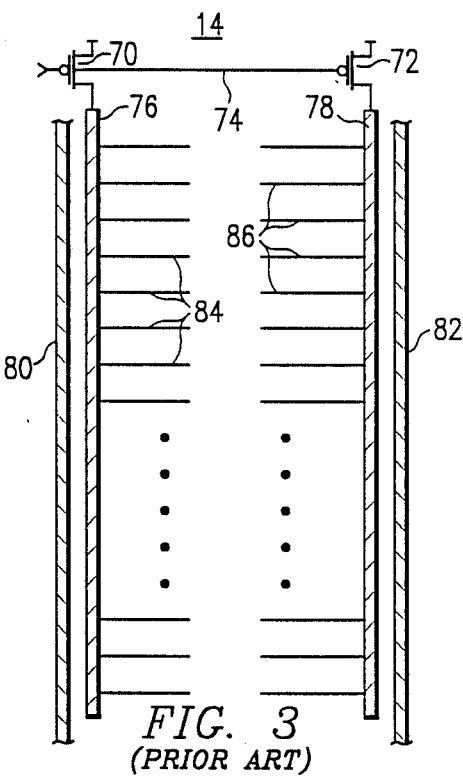
FIG. 3 is a diagram of a pull-up signal routing design for a DRAM according to the prior art.

Global pull-up and pull-down signals are therefore necessary for the operation of a CMOS DRAM chip. A conventional routing of such pull-up and pull-down lines is shown in FIG. 3. Only the pull-up lines are shown together with the $V_{dd}$ and $V_{ss}$ lines; the pull-down conductors have been omitted for clarity.

A pair of pull-up driver transistors 70 and 72 are formed in the peripheral end 14. These are actuated by a single pull-up driver signal line 74. The drains of the p-channel pull-up driver transistors 70 and 72 are connected to respective ends of very large longitudinal pull-up conductors 76 and 78, respectively, that are routed down the sides of the array area 12 on either side of the sense amplifier banks 20 (FIG. 1). Routed in parallel with these are a very wide $V_{dd}$ conductor 80 and a similar $V_{ss}$ conductor 82. A plurality of transverse pull-up conductors 84 are connected to the longitudinal side pull-up conductor 76 for the left column, and a similar plurality of transverse pull-up conductors 86 are connected to the single right longitudinal pull-up conductor 78. As will be more completely described below, the width of the transverse pull-up conductors 84 and 86 becomes prohibitive in large arrays if a reasonable average path of resistance is desired.

FIG. 4 is a schematic wiring diagram showing a pull-up distribution network according to the invention. A plurality of p-channel pull-up driver transistors 90 are distributed across the peripheral end 14, and are each actuated by pull-up signal driver line 74. Each pull-up driver transistor 90 is connected to an end of a respective thin longitudinal pull-up signal conductor 92 that runs over the entire array area 12. In a preferred embodiment, the longitudinal pull-up conductors 92 are interleaved with $V_{dd}$ supply lines 94 and $V_{ss}$ supply lines 96. There are further a plurality of pull-down conductors (not shown; see FIGS. 9-18) that are interleaved with the pull-up conductors 92. In the instance where a single pull-up signal is distributed to each sense amplifier within the array 12, it is preferred that each of the longitudinal pull-up conductors 92 be connected to each of a plurality of transverse pull-up conductors 98. The transverse pull-up conductors 98 are preferably formed in a first metal layer over the semiconductor surface while the longitudinal pull-up conductors 92 are formed in a second metal layer over the first metal layer.

At least one transverse pull-up conductor 98 is provided for each sense amplifier bank 20 (FIG. 1). For the purposes of this description and the claims, each column of sense amplifier banks 20 can be considered to be a separate array of sense amplifier banks, as the longitudinal and transverse conductors 92 and 98 formed over the left column are repeated in the right column.

Figure 5:
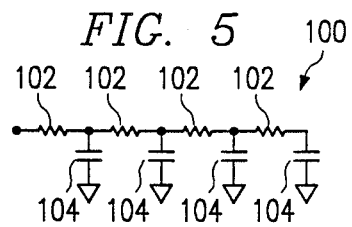
FIG. 5 a circuit diagram showing the modelling of a network of signal conductors.
Figure 6:
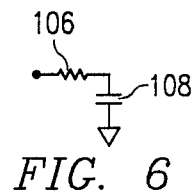
FIG. 6 a schematic electrical diagram of an equivalent lumped circuit to that of FIG. 5.

A principal advantage of the distributed network of the invention is its reduced transverse line conductor width for the same resistance. Referring to FIG. 5, a mathematical model of a distributed RC network is shown generally at 100. In the illustrated case, a transmission line has been divided into four resistive elements 102 with four capacitive elements 104 interspersed along the length of the line. As shown in FIG. 6, this distributed RC network can be modeled as a single resistance 106 and a single capacitance 108, with the single resistance being equivalent to ar if r is the resistance of the distributed network. "a" is a constant which is typically taken as $\frac{1}{2}$.

FIG. 7 shows how this modelling concept is applied to the distributed signal network according to the invention. A single transverse signal conductor 98 is shown having a finite width W. The transverse signal conductor 98 is coupled at s intervals by longitudinal signal conductors 92. A resistance 110 and a load capacitance 112 may be modeled for each half of a length s.

From FIG. 7, it can be shown that:

$$r = a(s/2)(1/w)\, r(M1) \quad (1)$$

$$c = 1/2\, (1/n\, (C_{total})) \quad (2)$$

$$s = 1/n\, (L_{total}) \quad (3)$$

where r is the resistance of one half of an s length of transverse conductor 98; M1 is the resistivity of the metal used to form the transverse conductor 98; c is the load capacitance associated with one half of an s length of the transverse capacitor 98; and n is the number of longitudinal conductors 92 used to distribute the signal to the transverse conductors 98. The equivalent resistance $R_{eq}$ is given as:

$$R_{eq} = \frac{aL_{total} r(M1)}{w 4 n^2} \quad (4)$$

Referring now to FIG. 8, a modelling of a non-distributed signal network is shown. The relatively wide transverse conductor 84 has a width $w_{nd}$ and a length $L_{total}$ from its end to its connection with the single pull-up signal side rail 76. The equivalent resistance for this non-distributed circuit is:

$$R_{eq} = \frac{aL_{total} r(M1)}{w_{nd}} \quad (5)$$

To obtain the same resistance, $r_{eq}$ equals $r_{nd}$ and:

$$\frac{w_{nd}}{w} = 4n^2 \quad (6)$$

As can be seen, the required width of the transverse conductor according to the non-distributed scheme varies as four times the square of the number of longitudinal distributed conductors 98 of the distribution network of the invention. As will be explained below, n is equal to 13 for the 4 megabit DRAM design shown. $w_{nd}$ will therefore have to be 676w, or 675 times larger than the width of a transverse conductor 98 according to the invention. The invention therefore allows a 4 megabit DRAM chip of reduced size because of the reduced width of the transverse conductors.

Figure 9:
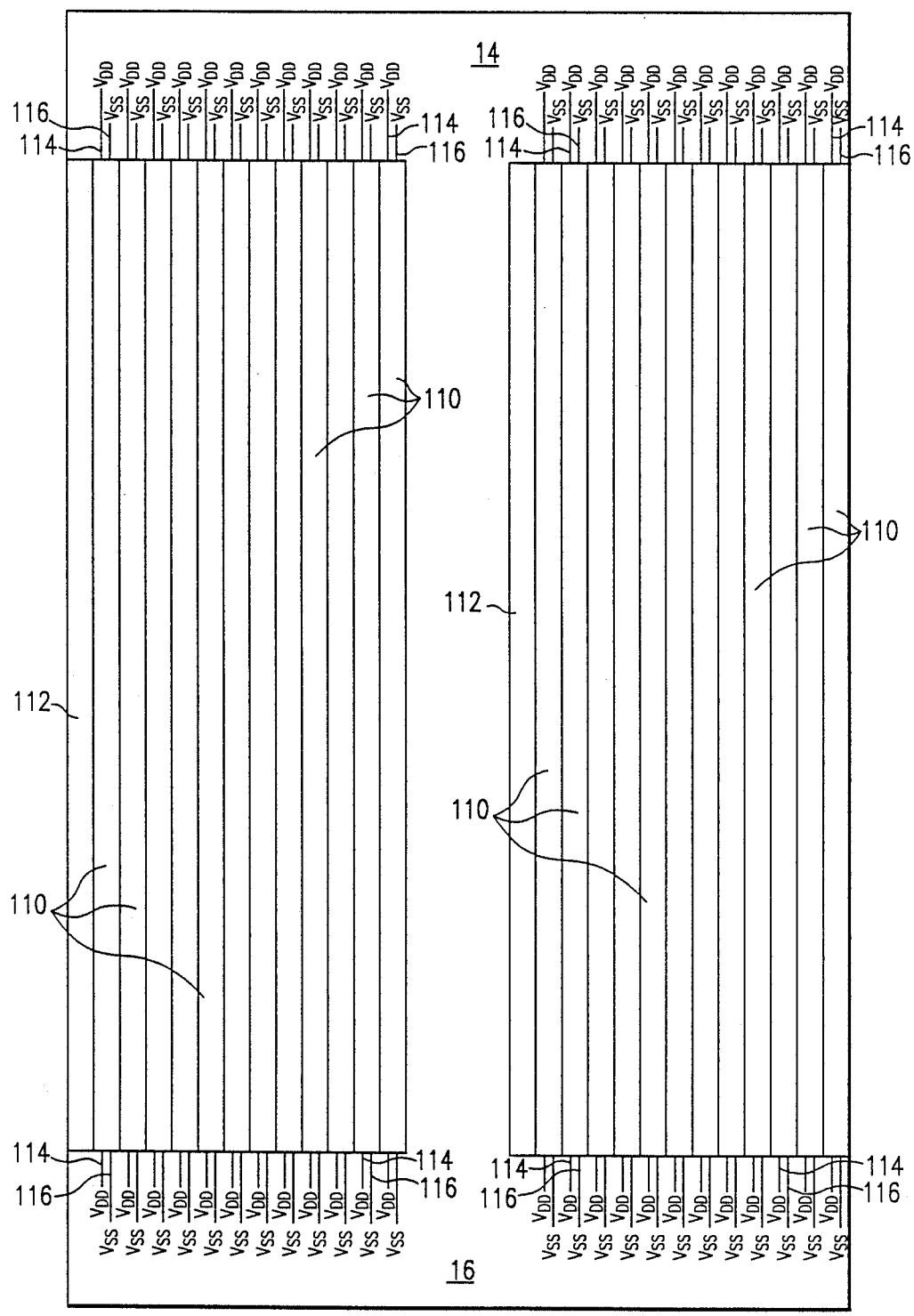
FIG. 9 is a schematic plan view showing major repeating blocks of longitudinal signal conductors for the DRAM layout shown in FIG. 1.

A particular application of the distributed network to the 4 megabit DRAM chip shown in FIG. 1 is illustrated in conjunction with FIGS. 9-18. FIG. 9 is a schematic layout of longitudinal signal conductor blocks that roughly corresponds in scale to the layout shown in FIG. 1. Between the first peripheral end 14 and the second peripheral end 16, a plurality of main longitudinal conductor blocks 110 and a pair of edge longitudinal conductor blocks 112 are mapped out. For each column of the array area 12, there are twelve main conductor blocks 110 and one edge conductor block 112. A pair of $V_{dd}$ and $V_{ss}$ lines 114 and 116 are provided for each main conductor block 110, but none are provided for the edge conductor block 112. The $V_{dd}$ and $V_{ss}$ lines 114 and 116 extend through the entire array area 12 from the first end 14 to the second end 16.

FIG. 10 is a schematic layout diagram of a single main longitudinal conductor block 110. Each main conductor block 110 consists of a sub-block 118, two sub-blocks 120 and an end sub-block 122. Each space between pairs of horizontal dashed lines represents a sense amplifier bank 20 as shown in FIG. 1. Sub-block 118 and sub-blocks 120 each cover portions of four sense amplifier banks 20, while sub-block 122 covers a portion of each of five sense amplifier banks 20.

A plurality of longitudinal pull-up and pull-down conductors 92 connects the blocks together. There are eight of these: four for four different pull-up signals $PC_1$–$PC_4$, and four for four different pull-down signals $NC_1$–$NC_4$.

The longitudinal conductors 92 connect the blocks 118, 120 and 122 to an end peripheral circuit block 124 that is a portion of end peripheral area 14. Conductors 92 further connect sub-blocks 118-122 to a second end peripheral portion 126 that is a portion of end peripheral area 16.

FIG. 11 is a schematic diagram of an edge block 112. The edge block 112 is similar in most respects to a main block 110. The edge block 112 has the same series of sub-blocks 118, 120 and 122 interconnected by eight longitudinal pull-up and pull-down conductors 92. The longitudinal conductors 92 connect the sub-blocks 118-122 to a first end peripheral circuit block 128 and a second end peripheral circuit block 130. The longitudinal conductor block 112 differs from block 110 in that no voltage supply lines (114, 116; FIG. 10) are provided.

FIGS. 12-18 are details of the various sub-blocks introduced in FIGS. 10 and 11. FIG. 12 is a schematic wiring diagram of the sub-block 118 used as a component of both a main block 110 and an edge block 112. The longitudinal conductors 92 are disposed from the top to the bottom of the sub-block 118 and in the illustrated embodiment are assigned the right-to-left order $NC_1$, $PC_1$, $NC_2$, $PC_2$, $NC_3$, $PC_3$, $NC_4$ and $PC_4$. Four different pull-up signals ($PC_1$–$PC_4$) and four different pull-down signals ($NC_1$–$NC_4$) are available for connection to the sense amplifier banks 20 that they intersect. A first sense amplifier bank 140 has two transverse signal conductors 98. One of these is connected to the $NC_1$ pull-down signal line and one is connected to the $PC_1$ pull-up signal line. Sub-block 118 further has three other sense amplifier banks 142. Each of these has two transverse pull-up signal conductors, and one transverse pull-down signal conductor 98. The two pull-up signal conductors 98 are connected to different ones of the longitudinal pull-up signal conductors. This is so that any one longitudinal pull-up signal conductor is connected to a pair of sense amplifier banks that flank one cell array 18 (FIG. 1). In this manner, any one particular sense amplifier bank 20 is connected to one of the four pull-down signals and either one or two of the four pull-up signals. The pull-up and pull-down operation can therefore be applied to an interleaved one fourth of the entire array area while the remaining interleaved three fourths of the array area remain inactive.

FIG. 13 is a similar wiring diagram for the sub-block 120 that is itself a component of the main and edge longitudinal conductor blocks 110 and 112 (FIGS. 10 and 11). Each sense amplifier bank 20, represented by a pair of dashed lines, is provided with a single transverse pull-down conductor 144 and two transverse pull-up conductors 146. The transverse pull-down conductor 144 for any one particular sense amplifier bank 20 is connected to one of the four longitudinal pull-down conductors 92, while the two transverse pull-up conductors 146 are connected to different ones of pull-up conductors 92.

FIG. 14 is a schematic wiring diagram for the sub-block 122 that is used as a component of blocks 110 and 112 (FIGS. 10 and 11). Sub-block 122 passes over portions of five different sense amplifier banks 20. Four sense amplifier banks 142 are each provided with a single transverse pull-down conductor 144 and two pull-up conductors 146. The lowest sense amplifier bank 148 is provided with a single pull-down conductor 144 and only one pull-up conductor 146, as it flanks only one cell array 18 (FIG. 1). As for the sub-blocks illustrated in FIGS. 12 and 13, each of the sense amplifier banks 142 are connected to one of four pull-down signals and two out of four pull-up signals through appropriate longitudinal signal conductors 98. The sense amplifier bank 148 is connected to one pull-down signal and one pull-up signal.

Figure 15:
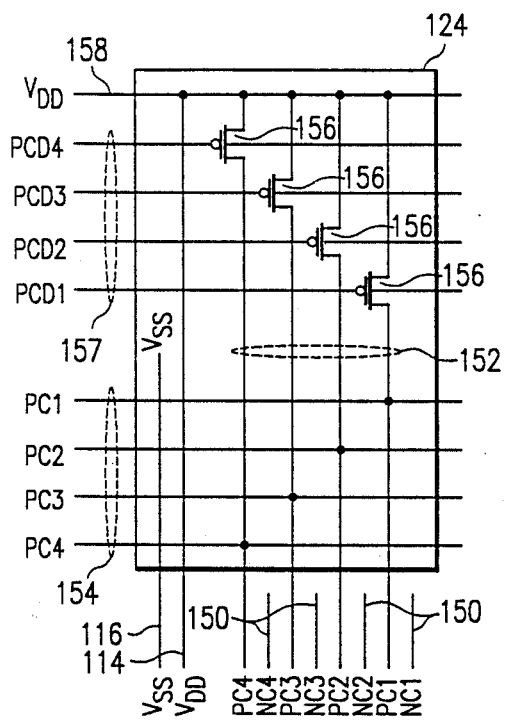
FIG. 15-18 are schematic electrical wiring diagrams of certain sub-blocks of peripheral areas as shown in FIGS. 10 and 11.

FIGS. 15-18 are wiring diagrams of respective sub-blocks 124, 126, 128 and 130 as used as components for main block 110 and edge block 112 (FIGS. 10 and 11). In FIG. 15, the longitudinal pull-down conductors 150 and $V_{ss}$ longitudinal conductor 116 terminate without connection. Each longitudinal pull-up conductor 152 is however connected to a respective transverse pull-up conductor 154 that extends across the entire end peripheral area 14 (FIG. 1). The transverse conductors 154 operate to more evenly distribute the particular pull-up signals with which they are associated.

Each longitudinal pull-up conductor 152 is further connected to the drain of a respective p-channel pull-up signal driver transistor 156. Within each sub-block 124, four such driver transistors 156 are provided, one for each of the pull-up signals $PC_1$–$PC_4$ The sources of the driver transistors 156 are connected to $V_{dd}$, while the gates thereof are connected to respective pull-up driver signals 157 ($PCD_1$–$PCD_4$) The $V_{dd}$ longitudinal conductor 114 is connected to a $V_{dd}$ rail 158, which in turn is connected to a $V_{dd}$ bonding pad (not shown) located within the end peripheral area 14 (FIG. 1).

Figure 16:
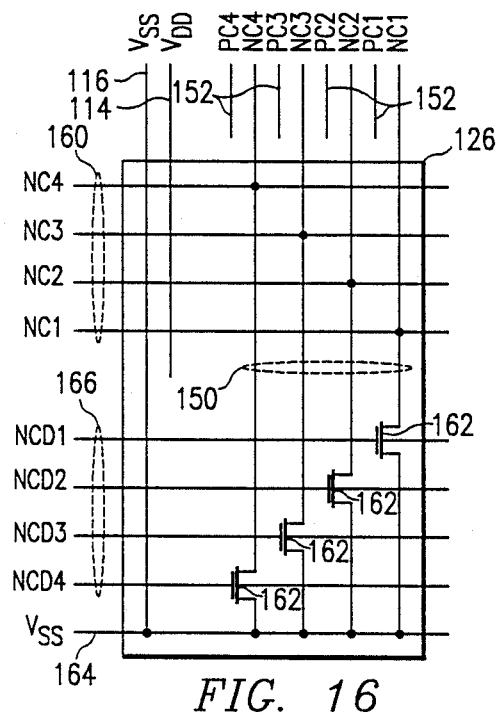

FIG. 16 is a schematic wiring diagram of an end peripheral block 126. Within block 126, the longitudinal pull-up conductors 152 and the $V_{dd}$ conductor 114 terminate without connection. Longitudinal pull-down conductors 150 are however connected to respective transverse pull-down conductors 160 which act to more evenly distribute the pull-down signals to the array. Longitudinal pull-down conductors 150 are further connected to the drains of respective pull-down driver transistors 162. The sources of driver transistors 162 are connected to a $V_{ss}$ rail 164, as is the $V_{ss}$ longitudinal conductor 116. The $V_{ss}$ rail 164 is in turn connected to a $V_{ss}$ bonding pad (not shown) located within end peripheral area 16 (FIG. 1). The transverse pull-down conductors 160 run across the entire width of end peripheral area 16 (FIG. 1). The gates of pull-down driver transistors 162 are connected to respective transverse pull-down signal lines 188 ($NCD_1$–$NCD_4$) for independent actuation of different pull-down signals.

Figure 17:
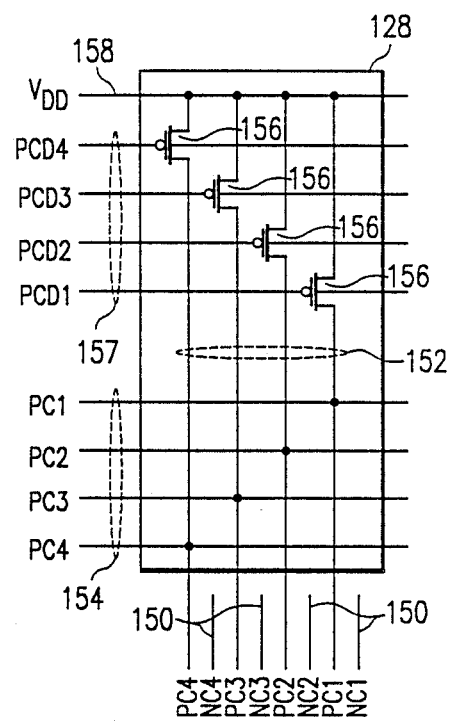

FIG. 17 is a schematic wiring diagram of an end peripheral circuit block 128 as shown in FIG. 11.

Block 128 is generally similar to the block 124 illustrated by FIG. 15, except for the absence of a $V_{dd}$ longitudinal conductor 114 and a $V_{ss}$ longitudinal conductor 116.

Figure 18:
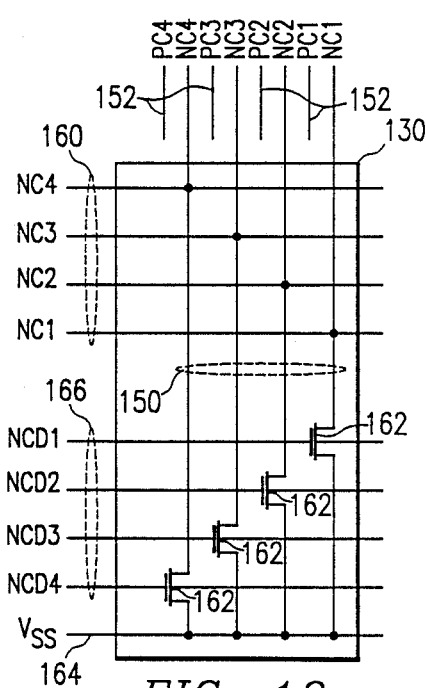

FIG. 18 is a wiring diagram of end peripheral circuit block 130 as introduced in FIG. 11. As may be seen, block 130 is generally similar to block 126 as shown by FIG. 16, with the absence of the $V_{dd}$ and $V_{ss}$ voltage supply longitudinal conductor lines 114 and 116 (FIG. 16).

The present invention has been described in conjunction with a 4 megabit DRAM design, but has application to any DRAM, or indeed to any array of similar integrated circuits requiring the routing of a global signal to each of the circuits in the array. By substituting a distributed network for side rails and laterals, the present invention provides a substantial savings in transverse signal conductor width, and further confers advantages in evenness of distribution and timing.

While a preferred embodiment and its advantages have been described in the above detailed description, the invention is not limited thereto but only by the scope and spirit of the appended claims.

What is claimed is:

1. A distributed signal transmission circuit for an array of integrated circuits formed in rows on a chip, comprising:

a signal driver circuit formed in a peripheral area of said chip for generating a signal;

a plurality of elongate longitudinal signal conductors coupled to said driver circuit for transmitting said signal, said longitudinal conductors formed over said array to intersect each of said rows;

at least one transverse signal conductor formed in each row and coupled to at least some of said longitudinal conductors for receiving said signal therefrom; and said integrated circuits formed in said row coupled to said transverse signal conductor for receiving said signal therefrom.

2. The circuit of claim 1, and further comprising a plurality of elongate generally parallel longitudinal voltage supply conductors interleaved in parallel with said longitudinal signal conductors for extending over said array.

3. The circuit of claim 1, wherein said transverse signal conductors are formed in a first metal layer proximate a surface of said integrated circuit array, said longitudinal signal conductors formed in a second metal layer over said first metal layer.

4. The circuit of claim 1, wherein each transverse signal conductor is connected to each of said longitudinal signal conductors.

5. The circuit of claim 1, wherein said longitudinal conductors comprise a plurality of conductor sets, longitudinal conductors from each set interleaved with longitudinal conductors of each other set over the array, any one transverse signal conductor connected to only one of said sets.

6. The circuit of claim 1, wherein said peripheral area is formed adjacent one end of said array, a plurality of outputs of said signal driver circuit formed spaced from one another in a direction at an angle to said longitudinal conductors, respective longitudinal conductors coupled to respective ones of said outputs.

7. The circuit of claim 6, and further comprising a peripheral transverse conductor connected to at least some of said longitudinal signal conductors and formed within said peripheral area to connect at least some of said outputs of said signal driver circuit in common.

8. The circuit of claim 6, wherein said outputs of said signal driver circuit are formed in a plurality of sets each having a plurality of said outputs, each set operable to transmit a separate signal;

at least one transverse conductor for each set formed to connect said outputs of said set in common, said transverse conductor formed within said peripheral area.

9. The circuit of claim 6, wherein said signal driver circuit comprises a plurality of transistors distributed across the peripheral area in a direction at an angle to said longitudinal signal conductors, current paths of said transistors connecting ends of said longitudinal signal conductors to a voltage supply source, at least some gates of said transistors coupled to a driver signal source for actuating said transistors.

10. The circuit of claim 1, and further comprising first and second peripheral areas at opposed ends of said integrated circuit chip, a first signal driver circuit formed in said first peripheral area, said longitudinal conductors including first and second longitudinal conductors, said first longitudinal conductors coupled to said first driver circuit for transmitting a first signal;
 a second signal driver circuit formed in said second peripheral area for generating a second signal, said second longitudinal conductors coupled to said second signal driver circuit for receiving said second signal and formed over said array to be interleaved with said first longitudinal conductors;
 at least a first and a second transverse signal conductor formed in each row, said first transverse signal conductor coupled to at least some of said first longitudinal conductors and said second transverse signal conductor coupled to at least some of said second longitudinal conductors for respectively receiving said first and second signals therefrom; and
 said integrated circuits formed in said row coupled to said first and second transverse signal conductors for receiving said first and second signals therefrom.

11. The circuit of claim 9, wherein said first signal driver circuit is operable to transmit a plurality of first signals, said first longitudinal signal conductors comprising a plurality of subsets each for transmitting a different first signal from said first driver circuit;
 said second signal driver circuit operable to transmit a plurality of second signals, said second longitudinal signal conductors comprising a plurality of subsets for transmitting a different second signal from said second driver circuit;
 said first transverse signal conductor coupled to a selected one of said subsets of said first longitudinal conductors, said second transverse signal conductor coupled to a selected one of said subsets of said second longitudinal signal conductors.

12. The circuit of claim 11, wherein said subset of said longitudinal signal conductors is interleaved with said remaining subsets.

13. The circuit of claim 12, wherein said first and second driver circuits each include a plurality of output sets for transmitting different respective signals to corresponding subsets of said longitudinal conductors, outputs of each output set disposed to be interleaved with outputs of the remaining output sets.

14. The circuit of claim 10, wherein said first transverse signal conductor is coupled to each first longitudinal conductor, said second transverse conductor coupled to each second longitudinal conductor.

15. The memory of claim 11, wherein said longitudinal signal conductors comprise a plurality of sets, longitudinal conductors of one set interleaved with longitudinal conductors of the other sets over the array area;
 said transverse signal conductor coupled to a single set of said longitudinal signal conductors.

16. The circuits of claim 1, wherein for a given signal transmission path resistance, the width of the traverse signal conductors is substantially decreased with respect to non-distributed signal transmission circuits.

17. A memory formed on an integrated circuit chip, comprising:
 a cell array area formed on said chip, a peripheral area of said chip formed adjacent to said cell array area;
 a plurality of sense amplifier banks arranged in rows in said cell array area;
 a plurality of elongate longitudinal signal conductors formed over said cell array area generally in parallel with each other and intersecting each said row, each row having at least one transverse signal conductor coupled to at least some of said longitudinal signal conductors, inputs of said sense amplifiers in said row coupled to said transverse signal conductor; and
 a signal driver circuit formed in said peripheral area, said longitudinal conductors coupled to said signal driver circuit for transmitting at least one signal from said driver circuit to said sense amplifiers in said cell array area.

18. The memory of claim 17, wherein said memory comprises a dynamic random access memory, signal driver circuit is operable to generate at least one pull-up signal for pulling up at least one selected high-going row line to $V_{dd}$.

19. The memory of claim 17, and further comprising a second peripheral area adjacent an end of said cell array area opposed to said peripheral area, a second signal driver circuit formed in said second area for generating at least one second signal;
 a plurality of second elongate longitudinal signal conductors formed over said cell array to be interleaved with and generally in parallel to said longitudinal signal conductors and intersecting each said row, each row having at least one second transverse signal conductor coupled to at least some of said second longitudinal signal conductors, second inputs of said sense amplifiers in said row coupled to said second transverse signal conductor for receiving said second signal therefrom.

20. The memory of claim 19, wherein said second signal comprises a pull-down signal for pulling down a low-going row line to $V_{ss}$.

21. The memory of claim 17, and further comprising a plurality of elongate longitudinal voltage supply lines interleaved with said longitudinal signal conductors over said array area.

22. The circuit of claim 17, wherein for a given signal transmission path resistance, the width of the traverse signal conductors is substantially decreased with respect to non-distributed signal transmission circuits.

23. A method for transmitting a signal from a peripheral area on a chip to a plurality of integrated circuits formed in rows in an array area of said chip, comprising the steps of:
 transmitting the signal on each of a plurality of elongate longitudinal conductors formed from the peripheral area and over the array area;
 at each of at least some of the rows, transmitting the signal from the longitudinal conductors to at least one transverse conductor coupled to at least some longitudinal conductors; and transmitting the signal on the transverse conductor to each integrated circuit in the row coupled to the transverse conductor.

24. The method of claim 23, and further comprising the steps of:

transmitting a second signal on each of a plurality of second elongate longitudinal conductors interleaved with the longitudinal conductors from a second peripheral area spaced from the peripheral area, and over the array area;

each of at least some of the rows, transmitting the second signal from at least some of the second longitudinal conductors to a second transverse conductor coupled to at least some of the second longitudinal conductors; and transmitting the second signal on the second transverse conductor to each integrated circuit in the row coupled to the second transverse conductor.

25. The method of claim 21, and further comprising the steps of:

transmitting a plurality of signals on respective sets of said elongate longitudinal conductors from the peripheral area and over the array area:

at each of a plurality of rows, transmitting one of the signals from each conductor of selected set of the first longitudinal conductors to the transverse conductor.

26. A method for transmitting a signal to each of a plurality of sense amplifiers in a cell array area on an integrated circuit memory chip, comprising:

actuating a plurality of signal drivers formed in a peripheral area to pass a signal to respective elongate generally parallel longitudinal signal conductors;

transmitting the signal on the longitudinal conductors over the cell array area;

at each of a plurality of sense amplifier banks in the cell array area, transmitting the signal from the longitudinal signal conductors to at least one transverse signal conductor; and transmitting the signal on the transverse signal conductor to each of a plurality of sense amplifiers in the bank.

27. A method for fabricating a signal transmission circuit for an array of integrated circuits, comprising the steps of:

forming the array of integrated circuits in rows;

forming a signal driver circuit in an area of the integrated chip peripheral to the array;

forming at least one transverse signal conductor in each row to be coupled to at least some of the integrated circuits therein;

forming a plurality of elongate longitudinal signal conductors to be coupled to the signal driver circuit, and to be disposed over the array such that the longitudinal conductors intersect each row: and at each row, coupling at least some of the longitudinal signal conductors to a transverse signal conductor.

28. The method of claim 27, and further comprising the step of connecting outputs of the signal driver circuit in the peripheral area with a transverse conductor for more even distribution of the signal.

29. The method of claim 27, and further comprising the step of distributing a plurality of driver transistors of the driver circuit across the peripheral area: and connecting outputs of the driver transistors in common to the longitudinal signal conductors.

30. The method of claim 27, and further comprising the steps of:

forming a second signal driver circuit in a second peripheral area of the integrated circuit chip opposed to said peripheral area:

forming at least one second transverse signal conductor for each row:

connecting each second transverse signal conductor to respective selected ones of the second longitudinal signal conductors and forming a plurality of second longitudinal signal conductors over the array to be interleaved with the first longitudinal signal conductors and to be coupled to said second signal driver circuit.

* * * * *